United States Patent
Kotani et al.

(10) Patent No.: US 10,014,453 B2
(45) Date of Patent: Jul. 3, 2018

(54) SEMICONDUCTOR LIGHT-EMITTING DEVICE EMITTING LIGHT MIXTURES WITH SUBSTANTIALLY WHITE TONE

(71) Applicant: Stanley Electric Co., Ltd., Tokyo (JP)

(72) Inventors: Hiroshi Kotani, Tokyo (JP); Takaaki Sakai, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/515,713

(22) Filed: Oct. 16, 2014

(65) Prior Publication Data

US 2015/0108523 A1  Apr. 23, 2015

(30) Foreign Application Priority Data

Oct. 18, 2013 (JP) ................................. 2013-217603

(51) Int. Cl.
   *H01L 33/58* (2010.01)
   *H01L 33/50* (2010.01)
   *H01L 25/075* (2006.01)

(52) U.S. Cl.
   CPC ............ *H01L 33/58* (2013.01); *H01L 33/505* (2013.01); *H01L 25/0753* (2013.01);
   (Continued)

(58) Field of Classification Search
   CPC ..... H01L 33/58; H01L 33/505; H01L 33/504; H01L 25/0753
   See application file for complete search history.

(56) References Cited

U.S. PATENT DOCUMENTS

2003/0071568 A1  4/2003  Lowery et al.
2012/0211774 A1  8/2012  Harada
(Continued)

FOREIGN PATENT DOCUMENTS

JP  2003-101075 A  4/2003
JP  2005-209852 A  8/2005
(Continued)

OTHER PUBLICATIONS

Japanese Office Action for the related Japanese Patent Application No. 2013-217603 dated May 23, 2017.

*Primary Examiner* — Laura Menz
*Assistant Examiner* — Candice Y Chan
(74) *Attorney, Agent, or Firm* — Kenealy Vaidya LLP

(57) ABSTRACT

A reliable semiconductor light-emitting device can include a mounting board, at least one semiconductor light-emitting chip mounted on the mounting board, a wavelength converting layer having a side surface covering the light-emitting chip, and a seal member having an opening contacting the side surface of the wavelength converting layer and covering chip electrodes. The light-emitting device can also include a transparent layer disposed into the opening of the sealing member so as to be located over the light-emitting chip and within a top surface of the light-emitting chip, and can be configured to emit various mixture lights having a high uniformity by using lights emitted from the light-emitting chip and the wavelength converting layer. Thus, the disclosed subject matter can provide the reliable light-emitting device, which can emit the mixture lights including a substantially white color light from a small light-emitting surface as a light source for a headlight, etc.

19 Claims, 9 Drawing Sheets

(52) U.S. Cl.
CPC .. *H01L 33/504* (2013.01); *H01L 2224/48091* (2013.01); *H01L 2224/48465* (2013.01); *H01L 2224/8592* (2013.01)

(56) References Cited

U.S. PATENT DOCUMENTS

| | | |
|---|---|---|
| 2012/0242216 A1 | 9/2012 | Kotani et al. |
| 2013/0126926 A1* | 5/2013 | Sakai .................. H01L 33/005 257/98 |
| 2013/0188381 A1 | 7/2013 | Kotani |
| 2014/0014980 A1 | 1/2014 | Morimoto |

FOREIGN PATENT DOCUMENTS

| | | |
|---|---|---|
| JP | 2008-159705 A | 7/2008 |
| JP | 2012-169442 A | 9/2012 |
| JP | 2012-199411 A | 10/2012 |
| JP | 2012-216726 A | 11/2012 |

* cited by examiner

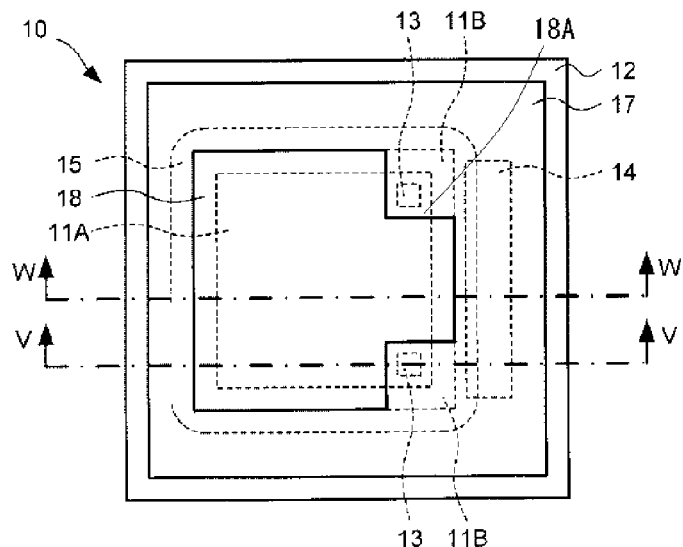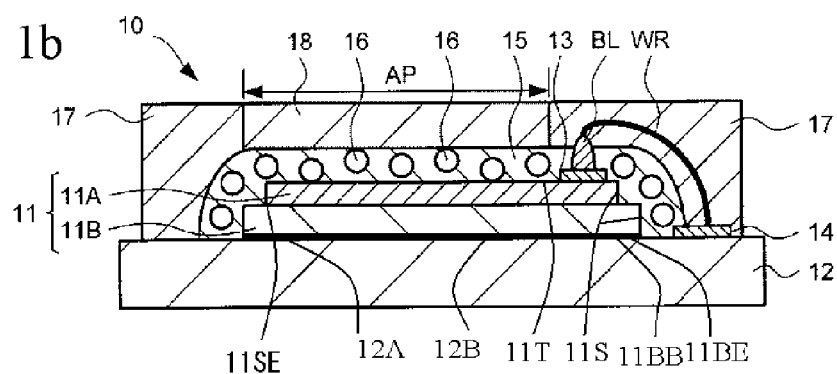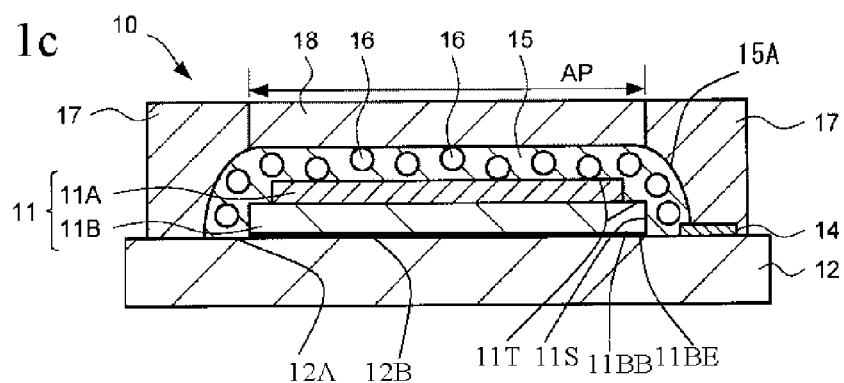

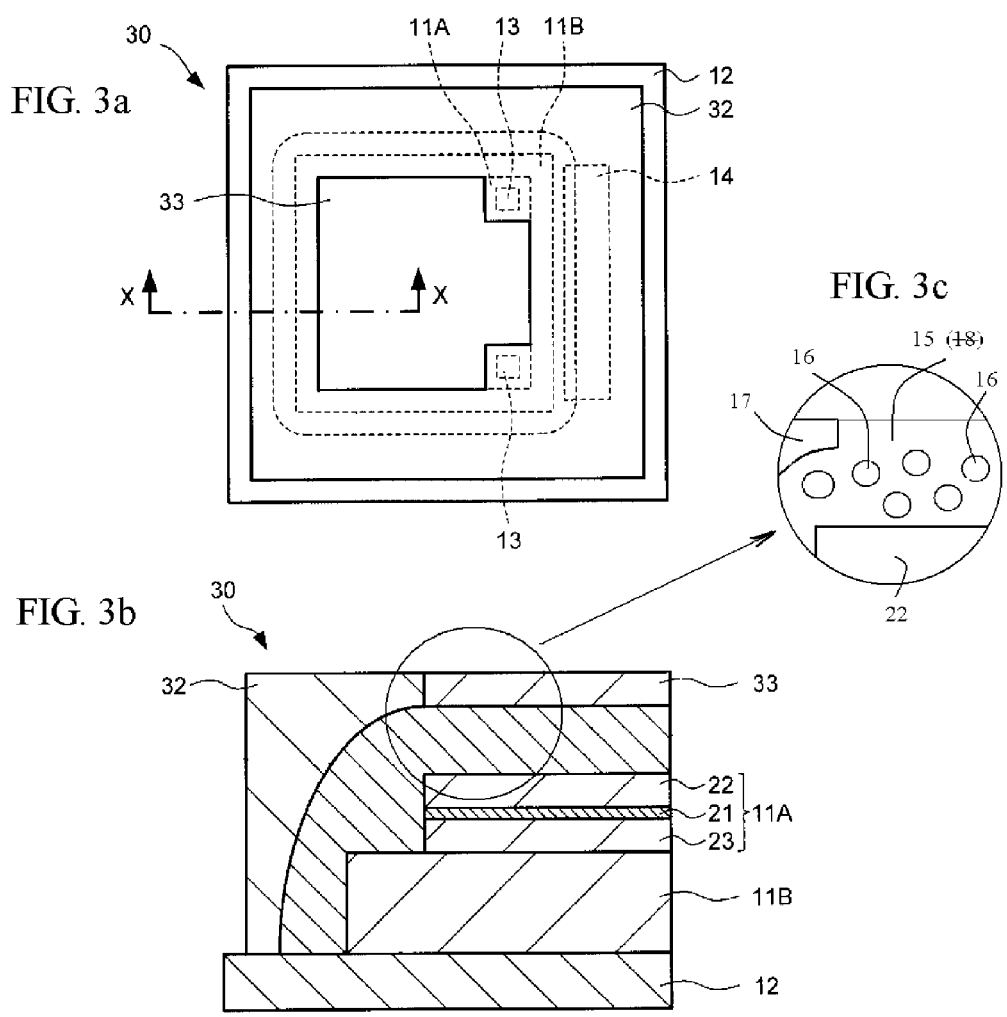

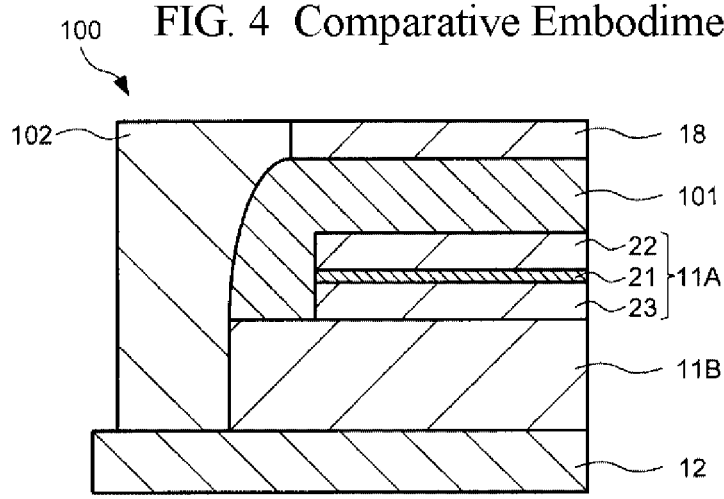
FIG. 4 Comparative Embodiment

FIG. 5

| | Chromaticity value (x, y) |
|---|---|
| First Embodiment | Middle portion ( 0.330, 0.344 ) <br> Peripheral portion ( 0.340, 0.355 ) <br> Difference (-0.010, -0.011) |
| First Variation | Middle portion ( 0.334, 0.348 ) <br> Peripheral portion ( 0.335, 0.350 ) <br> Difference (-0.01, -0.002) |
| Comparative Embodiment | Middle portion ( 0.332, 0.344 ) <br> Peripheral portion ( 0.378, 0.425 ) <br> Difference (-0.046, -0.081) |

SEMICONDUCTOR LIGHT-EMITTING DEVICE EMITTING LIGHT MIXTURES WITH SUBSTANTIALLY WHITE TONE

This application claims the priority benefit under 35 U.S.C. § 119 of Japanese Patent Application No. 2013-217603 filed on Oct. 18, 2013, which is hereby incorporated in its entirety by reference.

BACKGROUND

1. Field

The presently disclosed subject matter relates to semiconductor light-emitting devices in which light emitted from a semiconductor light-emitting chip is wavelength-converted by a wavelength converting material, and more particularly relates to reliable semiconductor light-emitting devices for a vehicle headlight and the like, which can project a mixture light having a substantially uniform color tone in a wide range even when they enlarge the mixture light emitted from a small light-emitting surface in the wide range via optical members such as a reflector, a projector lens, etc.

2. Description of the Related Art

Semiconductor light-emitting devices, in which a part of the light emitted from a semiconductor light-emitting chip is converted into light having a different wavelength by a wavelength converting material and in which the mixture light including the light having the different wavelength mixed with the light emitted directly from the semiconductor light-emitting chip is emitted, have been known as a semiconductor light source for various lighting units. In these conventional cases, the semiconductor light-emitting devices are frequently provided with the wavelength converting layer composed of a resin layer including a phosphor particle on or over the semiconductor light-emitting chip such as an LED chip, etc.

Conventional semiconductor light-emitting devices including such a wavelength converting material are, for example, disclosed in Patent Document No. 1 (Japanese Patent Application Laid Open JP2012-169442) and Patent Document No. 2 (Japanese Patent Application Laid Open JP2012-199411), etc. FIG. 7 is a side cross-sectional view showing a first conventional semiconductor light-emitting device, which is disclosed in Patent Document No. 1.

The conventional semiconductor light-emitting device 60 includes: a base board 69; a semiconductor light-emitting chip 61 including a light-emitting layer 61A, a chip substrate 61B and electrodes 61C located on the light-emitting layer 61A, and mounted on the base board 69; a conductor pattern 67 formed on the base board 69; bonding wires 62 electrically connecting between the electrodes 61C of the semiconductor light-emitting chip 61 and the conductor pattern 67; a transparent layer 64 located over a top surface of the light-emitting layer 61A of the semiconductor light-emitting chip 61, and a bottom surface thereof being smaller than the top surface of the light-emitting layer 61A; a wavelength converting material 63 having a convex side surface 63S disposed between the top surface of the semiconductor light-emitting chip 61 and the bottom surface of the transparent layer 64; a frame 66 located on the base board 69 so as to surround at least the semiconductor light-emitting chip 61, the wavelength converting material 63 and the transparent layer 64; and a reflective material layer 65 disposed between the frame 66 and side surfaces of the chip substrate of the semiconductor light-emitting chip 61 and the transparent layer 64 and the convex side surface 63S of the wavelength converting material 63.

In the first conventional semiconductor light-emitting device 60, when the semiconductor light-emitting chip 61 is a blue LED chip and a yellow phosphor such as yttrium aluminum garnet (YAG) is used as a phosphor for the wavelength converting material 63, the semiconductor light-emitting device 60 may emit a mixture light having a substantially white color tone, which mixes yellow light wavelength-converted by the wavelength converting material 63 with blue light emitted directly from the semiconductor light-emitting chip 61.

In general, when the semiconductor light-emitting devices are used as a light source for a lighting unit such as a vehicle headlight, which controls light emitted from the light-emitting devices using a reflector and/or a projector lens, a light-emitting device having a small light-emitting surface may be required to efficiently control light emitted from the light-emitting device with a small optical structure. Accordingly, the semiconductor light-emitting device 60 can be used as a light source for the lighting unit such as a headlight, because the light-emitting device 60 may emit the mixture light having the substantially white color tone and a high light-emitting intensity from a small light-emitting surface, which is a top surface of the transparent layer 64 that is smaller than the top surface of the light-emitting layer 61A of the semiconductor light-emitting chip 61.

In such a structure, the semiconductor light-emitting device 60 may emit a uniform mixture light having the substantially white color tone from a middle portion of the light-emitting surface, which is the top surface of the transparent layer 64. However, such the structure may tend to emit a mixture light having a little different color tone from the white color tone from a peripheral portion of the light-emitting surface because of various reasons such as optical characteristics, physical characteristics, etc.

A difference between the mixture light having the substantially white color tone emitted from the middle portion of the light-emitting surface and the mixture light having the little different color tone emitted from the peripheral portion may cause a chromatic variability in white color light emitted from the whole light-emitting surface of the light-emitting device 60. Especially, when the white color light emitted from the whole light-emitting surface of the light-emitting device 60 is projected and enlarged by the reflector and/or the projector lens, for example, to form a light distribution pattern of a headlight, the chromatic variability could fail to form a favorable light distribution pattern.

Hence, a second conventional semiconductor light-emitting device, which can reduce the chromatic variability, is disclosed in Patent Document No. 2 by the same inventors as this application. FIGS. 8a, 8b and 8c are, respectively, a top view, and side cross-sectional views taken along lines A-A and B-B shown in FIG. 8a, showing the second conventional semiconductor light-emitting device, which is disclosed in Patent Document No. 2.

The second conventional semiconductor light-emitting device 50 includes: a mounting board 59; a light-emitting diode chip 51 (LED chip 51) including a light-emitting layer 52, a substrate layer 53 and electrodes 55 located on the light-emitting layer 52, and mounted on the mounting board 59; a conductor pattern 56 formed on the mounting board 59; each of bonding wires 57 electrically connecting between a respect one of the electrodes 55 of the LED chip 51 and the conductor pattern 56; a wavelength converting material 54 having a convex side surface covering a top surface of the substrate layer 53 along with a top and side surface of the light-emitting layer 52 of the LED chip 51; and a transparent layer 58 disposed on the wavelength converting material as a light-emitting surface of the device 50 so as to be able to emit a mixture light, which mixes light wavelength-converted by the wavelength converting material 54 with light emitted directly from the LED chip 51.

In this case, when the LED chip 52 is a blue LED chip and a yellow phosphor such as yttrium aluminum garnet (YAG) is used as a phosphor for the wavelength converting material 54, the semiconductor light-emitting device 50 may also emit a mixture light having a substantially white color tone by an additive color mixture of blue light and yellow light. In addition, the semiconductor light-emitting device 50 can reduce the chromatic variability by directly emitting the mixture light (white light) from the convex side surface of the wavelength converting material 54 not through the transparent layer 58 around the peripheral portion of the light-emitting surface (the transparent layer 58), which emits the mixture light having the little different color tone from the white color tone emitted from the middle portion of the light-emitting surface.

FIGS. 9*a* and 9*b* are a side view and a front view depicting a measuring method for evaluating a chromatic variability of the second conventional semiconductor light-emitting device 50, which is disclosed in Patent Document No. 2. The semiconductor light-emitting device 50 is mounted on a mounting board 41, and a screen 43 is located 10 meters away from the light-emitting device 50 so that an optical axis of the light-emitting device 50 intersects with the screen 43 at a right angle. Additionally, a projector lens 42 is located in front of the light-emitting device 50 toward the screen 43 so that an optical axis of the projector lens 42 corresponds to the optical axis of the light-emitting device 50 as shown in FIG. 8*a*.

When the semiconductor light-emitting device 50 turns on, the mixture light emitted from the light-emitting device 50 is projected and enlarged on the screen 43 as shown in FIG. 8*b*. In this case, a chromatic value of the middle portion (M) shows white color of (0.332, 0.344), and a chromatic value of the peripheral portion (P) shows white color of (0.338, 0.349), which is a substantially same value as that of the middle portion (M). Accordingly, the conventional semiconductor light-emitting device 50 can emit the mixture light (while light) having a substantially uniformity.

However, when such a structure is used as a light source for a headlight such that is subject to a vibration and the like, such the structure may lack credibility because the bonding wire 57, the wavelength converting material 54 and the transparent layer 58 are exposed from an external air.

The above-referenced Patent Documents are listed below, and are hereby incorporated with their English abstracts in their entireties.
1. Patent Document No. 1: Japanese Patent Application Laid Open JP2012-169442
2. Patent Document No. 2: Japanese Patent Application Laid Open JP2012-199411
3. Patent Document No. 3: U.S. Patent Publication No. US-2014-0014980-A1 (ST3001-0393)
4. Patent Document No. 4: U.S. Patent Publication No. US-2013-0188381-A1 (ST3001-0373)

The presently disclosed subject matter has been devised to consider the above and other problems, features, and characteristics in the conventional art devices. Embodiments of the disclosed subject matter can include reliable semiconductor light-emitting devices that can emit a wavelength converted light having a high uniformity and a high light-emitting efficiency from a small light-emitting surface. The disclosed subject matter can also include the reliable semiconductor light-emitting devices, which emits various color lights including a substantially white color light having a high uniformity and a high light-emitting intensity with a simple structure, and which can be used as a light source for vehicle lamps such as a headlight and the like, general lighting, a street lighting, a show room lighting, a stage lighting, etc.

SUMMARY

The presently disclosed subject matter has been devised in view of the above and other problems, features, and characteristics in the conventional art, and to make changes to existing semiconductor light-emitting devices. Thus, an aspect of the disclosed subject matter includes providing reliable semiconductor light-emitting devices, which can emit various mixture lights including a substantially white color tone having a high uniformity and a high light-emitting intensity, and which can be used for lighting units such as a vehicle headlight, general lighting and the like, which must be maintained at a high quality even when they have been used for a long time under harsh conditions. Another aspect of the disclosed subject matter includes providing reliable semiconductor light-emitting devices with a simpler structure while maintaining the above-described features.

According to an aspect of the disclosed subject matter, a semiconductor light-emitting device can include: a mounting board having a mounting surface; at least one semiconductor light-emitting chip having chip electrodes, including a semiconductor layer having a top surface and a side surface, and including a chip substrate having the top surface, the side surface and a bottom surface, each of the chip electrodes formed on either one of the top surface of the semiconductor layer or the bottom surface of the chip substrate, and the semiconductor light-emitting chip mounted on the mounting surface of the mounting board; and a wavelength converting layer having a side surface including at least one phosphor, and covering at least the top surface and the side surface of the semiconductor layer and the chip substrate of the light-emitting chip.

Additionally, the semiconductor light-emitting device can also include: a sealing member having an opening mounted on the mounting surface of the mounting board, the opening being located over the chip substrate of the semiconductor light-emitting chip in a direction substantially perpendicular to the top surface of the semiconductor layer, and being located between the side surface of the chip substrate and the side surface of the semiconductor layer of the light-emitting chip in a direction substantially parallel with the top surface of the semiconductor layer, the sealing member contacting with the side surface of the wavelength converting layer, and the opening having a cutout section when at least one of the chip electrodes of the light-emitting chip is formed on the top surface of the semiconductor layer, the cutout section of the opening projecting from the sealing member toward the opening, and the sealing member covering the at least one of the chip electrodes with the cutout section so as not to be exposed from the opening of the sealing member; a transparent layer disposed into the opening of the seal member; and wherein the top surface of the chip substrate of the semiconductor light-emitting chip adjacent the sealing member projects from an end of the side surface of the semiconductor layer of the semiconductor light-emitting chip adjacent the sealing member toward the sealing member, and the side surface of the wavelength converting layer is formed in a convex shape toward the sealing member.

According to another aspect of the disclosed subject matter, in the exemplary semiconductor light-emitting device described above, the wavelength converting layer can be disposed into the opening of the sealing member so that the wavelength converting layer buries the at least one phosphor into the wavelength converting layer, and thereby the transparent layer can be replaced with a transparent resin included in the wavelength converting layer. Therefore, the other aspect of the disclosed subject matter can include providing reliable semiconductor light-emitting devices with a simpler structure.

In the above-described exemplary semiconductor light-emitting devices, the opening of the sealing member can be located over the top surface of semiconductor layer within the top surface of the semiconductor layer of the semiconductor light-emitting chip in a direction substantially parallel with the top surface of the semiconductor layer to form a smaller light-emitting surface, and a light-emitting layer of the semiconductor layer can be formed between an n-typed semiconductor layer and a p-typed semiconductor layer to improve a light-emitting efficiency. Additionally, the at least one semiconductor light-emitting chip and the at least one phosphor can be one combination of the at least one semiconductor light-emitting chip is a blue light-emitting chip and the at least one phosphor of the wavelength converting layer is selected from the group consisting of a yellow phosphor, and two phosphors including a red phosphor layer and a green phosphor layer, and the at least one semiconductor light-emitting chip is an ultraviolet light-emitting chip and the at least one phosphor of the wavelength converting layer includes at least one of a red phosphor layer, a green phosphor layer and a blue phosphor to various mixture lights including a substantially white color light.

Moreover, the mounting board can be composed of either one of an Aluminum nitride substrate or a ceramic substrate to improve reliability, a radiating efficiency and like, and also the wavelength converting layer can include a transparent bead including at least one of oxide silicon ($SiO_2$) and alumina to enhance a uniformity of the mixture lights, and the sealing member can also include at least one of titanic oxide, alumina, and zinc oxide to improve a light-emitting efficiency, a light-emitting intensity, etc. In addition, when at least one of the chip electrodes of the light-emitting chip is formed on the bottom surface of the chip substrate, at least one of a reflective layer and a contact layer can be formed between the at least one of the chip electrodes and the bottom surface of the chip substrate to increase the light-emitting efficiency and the like, and when at least one of the chip electrodes of the light-emitting chip is formed on the top surface of the semiconductor layer, the sealing member can cover the at least one of the chip electrode to improve reliability. When the chip electrodes of the semiconductor light-emitting chip can be formed on the bottom surface of the chip substrate, the transparent layer can be formed in one shape of a square shape, a rectangular shape, a circular shape and an ellipsoidal shape to provide various light-emitting distributions in accordance with usages, etc.

According to the exemplary semiconductor light-emitting devices described above, a light-emitting surface can be formed in a smaller shape than the top surface of the semiconductor layer by using a top surface of the transparent layer, which can emit mixture lights mixing wavelength-converted lights by the wavelength converting layer with a part of direct lights emitted from the light-emitting chip with high efficiency using the above-described structures. The mixture lights emitted from the small light-emitting surface can improve a chromatic variation between a middle portion and a peripheral portion of the light-emitting surface by associating a comparatively long path length having a relatively large amount of wavelength-converted lights, which are repeatedly reflected on the side surface of the wavelength converting layer, the top surface and the side surface of the chip substrate of the light-emitting chips and the mounting surface located around the light-emitting chip with a comparatively short path length having a relatively large amount of direct lights emitted from the light-emitting chip, which is covered by the wavelength converting layer 15. Additionally, the structures can protect the wavelength converting layer and the light-emitting chip in confidence even when the light-emitting devices include the wire bonding WR. Thus, the disclosed subject matter can provide semiconductor light-emitting devices having a high reliability, a high uniform color tone and a high light-emitting intensity, which can be used for lighting units such as a vehicle headlight, general lighting and the like, which must be maintained at a high quality even when they have been used for a long time under harsh conditions.

BRIEF DESCRIPTION OF THE DRAWINGS

These and other characteristics and features of the disclosed subject matter will become clear from the following description with reference to the accompanying drawings, wherein:

FIG. 1a is an enlarged top view showing a first exemplary embodiment of a semiconductor light-emitting device made in accordance with principles of the disclosed subject matter, and FIGS. 1b and 1c are enlarged side cross-sectional views taken along lines V-V and W-W shown in FIG. 1a, respectively;

FIG. 3a is an enlarged top view showing a first exemplary variation of the semiconductor light-emitting device shown in FIG. 1a, FIG. 3b is an enlarged side cross-sectional view taken along line X-X shown in FIG. 3a, and FIG. 3c is a partial cross-sectional view showing a second variation of the semiconductor light-emitting device shown in FIG. 1a to FIG. 1c.

FIG. 4 is a comparative embodiment for evaluating the first embodiment shown in FIG. 1a to FIG. 1c and the first variation of the first embodiment shown in FIGS. 1a and 1b;

FIG. 5 is a table showing an evaluating result of the first embodiment, the first variation and the comparative embodiment shown in FIG. 4a;

FIG. 6b is an enlarged side cross-sectional view taken along lines Y-Y shown in FIG. 6a;

FIG. 9b is a front view showing evaluating portions on a screen shown in FIG. 9a.

DETAILED DESCRIPTION OF EXEMPLARY EMBODIMENTS

Figure 2A:
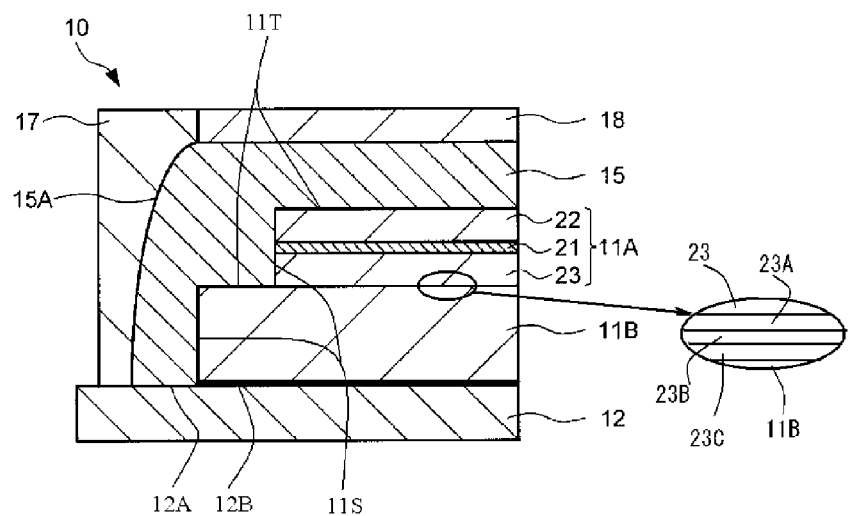
FIG. 2a is an enlarged cross-sectional view showing a peripheral portion of the first embodiment of the semiconductor light-emitting device shown in FIG. 1a to FIG. 1c.

Exemplary embodiments and manufacturing methods of the disclosed subject matter will now be described in detail with reference to FIGS. 1a to 6. FIG. 1a is a top view showing a first exemplary embodiment of a semiconductor light-emitting device made in accordance with principles of the disclosed subject matter, and FIGS. 1b and 1c are enlarged side cross-sectional views taken along lines V-V and W-W shown in FIG. 1a, respectively.

The semiconductor light-emitting device 10 can include: a mounting board 12 having a mounting surface 12A, a first conductor pattern 12B and a second conductor pattern 14 formed on the mounting surface 12A; and a semiconductor light-emitting chip 11 including a semiconductor layer 11A having a top surface 11T, a side surface 11S and an end 11SE of the side surface 11S, including a chip substrate 11B having the top surface 11T (the top surface 11T including top surfaces of the semiconductor light-emitting chip 11 and the chip substrate 11B), a bottom surface 11BB and the side surface 11S (the side surface 11S including side surfaces of the semiconductor light-emitting chip 11 and the chip substrate 11B), including a bottom electrode 11BE located underneath the bottom surface 11BB, and including at least one top electrode 13 located on the top surface 11T of the semiconductor layer 11A, the at least one top electrode 13 being electrically connected to the second conductor pattern 14 of the mounting board 12 via a bonding wire WR, the bottom electrode 11BE being electrically connected to the first conductor pattern 12B of the mounting surface 12A via a conductive adhesive material, and thereby the semiconductor light-emitting chip 11 mounted on the mounting surface 12A of the mounting board 12, and wherein the top surface 11T of the chip substrate 11B of the semiconductor light-emitting chip 11 projects from an end 11SE of the side surface 11S of the semiconductor layer 11A in an outward direction as shown in FIG. 1b.

In addition, the semiconductor light-emitting device 10 can also include: a wavelength converting layer 15 having a top surface and a side surface 15A including at least one phosphor 16, covering at least the top surface 11T and the side surface 11S of the semiconductor light-emitting chip 11 therewith, and the side surface 15A of the wavelength converting layer 15 formed in a convex shape in an opposite direction of the semiconductor light-emitting chip 11 as shown in FIG. 1c; a sealing member 17 having an opening AP mounted on the mounting surface 12A of the mounting board 12, and encapsulating the wavelength converting layer 15, the second conductor pattern 14 and the bonding wire WR by using the mounting surface 12A of the mounting board 12; and a transparent layer 18 having a top surface, a side surface and a bottom surface incorporating into the opening AP of the sealing member 17, the bottom surface of the transparent layer 18 facing the top surface of the wavelength converting layer 15, and the side surface 15A of the wavelength converting layer 15 contacting with the top surface of the wavelength converting layer 15. In FIG. 1b, the bonding wire WR is located over the wavelength converting layer 15. However, the bonding wire WR can also be located into the wavelength converting layer 15.

The bottom surface of the transparent layer 18 can be located over the top surface 11T of the semiconductor light-emitting chip 11, and can be a substantially same size as the top surface 11T of the semiconductor light-emitting chip 11. The bottom surface of the transparent layer 18 can also be located between the side surface 11S of the chip substrate 11B and the side surface 11S of the semiconductor layer 11A of the semiconductor light-emitting chip 11. The transparent layer 18 can include a cutout section 18A, which projects from the sealing member toward the opening AP, and which is located over the at least one top electrode 13 that does not emit light on the top surface 11T of the semiconductor layer 11A to protect the wire bonding WR with the sealing member 17. Accordingly, the transparent layer 18 including the cutout section 18A can be located over the top surface 11T of the semiconductor light-emitting chip 11 so that the sealing member 17 can cover the at least one top electrodes 13 of the semiconductor light-emitting chip 11 as shown in FIG. 1a.

In other words, an outermost periphery of the semiconductor light-emitting chip 11 will be completely blocked from view by the transparent layer 18 when the light-emitting device 10 is viewed from a position on the main optical axis which extends normal to the top center surface of the semiconductor light-emitting chip 11. Therefore, an inner side surface of the sealing member 17 can become a reflective surface, which can reflect light emitted in a crosswise direction from the semiconductor light-emitting chip 11 eventually toward the bottom surface of the transparent layer 18, as described later with reference to FIG. 2b.

In addition, because the sealing member 17 projects toward the transparent layer 18, the top surface of the transparent layer 18 can perform as a small light-emitting surface of the semiconductor light-emitting device 10. Thus, the disclosed subject matter can realize a very small light-emitting surface, which is substantially same as the top surface 11T of the semiconductor light-emitting chip 11 or is slightly smaller than the top surface 11T of the semiconductor light-emitting chip 11, by using the top surface of the transparent layer 18.

Next, each of the above-described elements will now be described in further detail. The mounting board 12 can include an Aluminum nitride substrate having a high thermal conductivity, a ceramic substrate and the like, and the conductor patterns 12B and 14 can be made from Au (gold) and the like and formed on the mounting surface 12A of the mounting board 12. A power supply can be provided directly to the semiconductor light-emitting chip 11 mounted on mounting board 12 via the first and second conductor patterns 12B and 14 of the mounting surface 12A, for example, using methods which are disclosed in Patent Document No. 3.

The semiconductor light-emitting chip 11 can be a blue LED chip(s) having a peak wavelength of approximately 440-450 nanometers. The wavelength converting layer 15 can include a phosphor configured to convert light emitted from the semiconductor light-emitting chip 11 into a particular wavelength or range of wavelengths of light. The phosphor 16 can be excited by the light emitted from the semiconductor light-emitting chip 11, and can emit a wavelength-converted light. Accordingly, the semiconductor light-emitting device 10 can emit a different wavelength from that of the semiconductor light-emitting chip 11 by an additive color mixture of a part of the light emitted from the semiconductor light-emitting chip 11 and the wavelength-converted light that is produced by phosphor (or other wavelength conversion material) being excited by another part of the light.

The wavelength converting layer 15 can include a resin layer that is made by mixing a yellow phosphor such as YAG with a transparent resin such as a silicone resin and the like. In this case, the semiconductor light-emitting chip 11 can be a blue LED chip having a peak wavelength of approximately 440-450 nanometers. The yellow phosphor can emit a yellow light upon being excited by blue light emitted from the blue LED chip. The semiconductor light-emitting device 10 can emit substantially white light such that the light can be used as a light source for a headlight, by an additive color mixture of the excited yellow light emitted from the yellow phosphor and a part of the blue light emitted from the blue LED chip.

As combining methods of the semiconductor light-emitting chip 11 and the wavelength converting layer 15 to emit various color mixture lights in accordance with a variety of usages, LED chips and laser diode chips and various phosphors, which are disclosed in Patent Document No. 4 by one of the inventors of this application, can be used as the semiconductor light-emitting chip 11 and the phosphor 16 of the wavelength converting layer 15, respectively.

In these cases, the wavelength converting layer 15 can be made by mixing the phosphor 16 with the transparent resin, a transparent bead and the like in order to be able to emit light having a desired color tone while collaborating with the semiconductor light-emitting chip 11. As the transparent bead, materials, which have a substantially same refractive index as that of the transparent resin and/or have a larger particle than a particle of the phosphor 16. Specifically, oxide silicon ($SiO_2$), alumina and the like can be used as the transparent bead. By including the phosphor 16 in the transparent bead, the transparent bead including the phosphor 16 can also be used as a wavelength converting material for the wavelength converting layer 15.

The sealing member 17 can be composed of a white color resin having a high reflectivity and non-conductivity, for example, a resin, in which at least one of titanic oxide, alumina, zinc oxide and the like is dispersed into a resin, can be used as the sealing member 17. The transparent layer 18 can be composed of a transparent material, in which the mixture light emitted via the wavelength converting layer 15 can transmit, for example, a glass such as silicon oxide ($SiO_2$), sapphire, a transparent resin such as a silicon resin, etc. The transparent layer 18 can have a substantially same refractive index as that of the transparent resin included in the wavelength converting layer 15, or a smaller refractive index than that of the transparent resin included in the wavelength converting layer 15 to prevent a decrease of light-emitting efficiency due to reflections on boundaries between the transparent layer 18 and the phosphor 16 and the transparent bead included in the transparent resin of the wavelength converting layer 15.

Here, an exemplary method for manufacturing the semiconductor light-emitting device 10 will now be described in a concise way with reference to FIG. 1a to FIG. 1c. Process 1 is mounting the semiconductor light-emitting chip 11 on the first conductor pattern 12B of the mounting board 12 via the conductive adhesive material, and connecting a ball BL formed on the top electrode 13 to the second conductor pattern 14 of the mounting board 12 via the bonding wire WR as shown in FIG. 1b.

Process 2 is mounting the sealing member 17 on the mounting surface 12A of the mounting board 12, and disposing an uncured wavelength converting material into the sealing member 17 from the opening AP. Process 3 is mounting the transparent layer 18 into the opening AP of the sealing member 17 and on the top surface of the uncured wavelength converting layer, and solidifying the uncured wavelength converting layer. As a result, the reliable semiconductor light-emitting device 10, in which the sealing member 17, the transparent layer 18 and the wavelength converting layer 15 attach with respect to each other using the resin included in the wavelength converting layer 15, can be completed.

However, the method for manufacturing the semiconductor light-emitting device 10 is not limited to the above-described method. Various methods can be employed in accordance with materials, manufacturing machines and the like for manufacturing the device 10. For example, the process 2 may also dispose the uncured wavelength converting material around the semiconductor light-emitting chip 11, and may solidify the uncured wavelength converting material, and also the process 3 may form the sealing member 17 around the wavelength converting layer 15, and may form the transparent layer 18 into the opening AP of the sealing member 17.

FIG. 2a is an enlarged cross-sectional view showing a peripheral portion of the semiconductor light-emitting device 10 shown in FIG. 1a to FIG. 1c. The semiconductor layer 11A can include an n-typed semiconductor layer 22, a light-emitting layer 21 and a p-typed semiconductor layer 23, which can include an electrode 23A, a reflective layer 23B and a contact layer 23C in turn toward the chip substrate 11B and which can be electrically connected to the chip substrate 11B via the contact layer 23C to emit the mixture light having a high light-emitting intensity with high efficiency. The chip substrate 11B can be configured with a conductive material such as Si, SiC, etc.

The wavelength converting layer 15 can cover at least the top surface 11T of the semiconductor layer 11A and the chip substrate 11B and the side surface 11S of the semiconductor layer 11A and the chip substrate 11B. The sealing member 17 can contact the wavelength converting layer 15 on the side surface 15A of the wavelength converting layer 15, and the side surface 15A of the wavelength converting layer 15 can be formed in a convex shape toward the sealing member 17 having a high reflectivity.

Here, movements of mixture lights in a case where the semiconductor light-emitting chip 11 is a blue LED and the wavelength length converting layer includes a yellow phosphor, are described with reference to FIG. 2. In this case, when the mixture lights (white lights) L1, L2, L3 and L4 are emitted from the transparent layer 18, which is used as a light-emitting surface, by wavelength-converting a part of light emitted from the light-emitting layer 21 and by mixing the part of light wavelength-converted with directly light emitted from the light-emitting layer 21, each of the movements of the white lights L1, L2, L3 and L4 will now be described.

Lights L1 are lights emitted from the light-emitting layer 21 toward the transparent layer 18. A part of the lights may be wavelength-converted by the wavelength converting layer 15 and may appropriately be mixed with another part of the lights not wavelength-converted by the wavelength converting layer in the direct lights emitted from the light-emitting layer 21. Then, the mixture lights can be emitted as the white lights L1 outward from the transparent layer 18, and may have a high light-emitting intensity because they may be emitted outward without substantially returning toward the wavelength converting layer 15.

Lights L2 are lights directed toward the transparent layer 18 after lights emitted from the light-emitting layer 21 toward the chip substrate 11B are reflected on a boundary surface between the semiconductor layer 11A and the chip substrate 11B. A part of the above-described lights may also be wavelength-converted by the wavelength converting layer 15 and may appropriately be mixed with another part of the lights not wavelength-converted by the wavelength converting layer in the direct lights emitted from the light-emitting layer 21. Then, the mixture lights can be emitted as the white lights L2 outward from the transparent layer 18, and may have a slightly lower light-emitting intensity that that of the white lights L1 because they are reflected on the boundary surface between the semiconductor layer 11A and the chip substrate 11B.

However, the mixture lights can contain a proper balance of blue lights and yellow lights in common with the white lights L1, and therefore can be emitted as the white lights L2 along with the white lights L1 outward from the transparent layer 18, in which the bottom surface of the transparent layer 18 is the substantially same as the top surface 11T of the semiconductor light-emitting chip 11, or substantially slightly smaller than the top surface 11T of the semiconductor light-emitting chip 11. Accordingly, the mixture lights L1 and L2 having a high light-emitting intensity emitted from a small light-emitting surface can reduce a chromatic variability.

Lights L3 are lights directed toward the transparent layer 18 after lights emitted in a crosswise direction from the light-emitting layer 21 toward the sealing member 17 are reflected on the side surface 15A of the wavelength converting layer 15 contacting with the sealing member 17 and besides are reflected on the top surface 11T of the chip substrate 11B. A part of the above-described lights may repeat a wavelength-conversion by the wavelength converting layer 15 and may be mixed with another part of the lights not wavelength-converted by the wavelength converting layer in directly the lights emitted from the light-emitting layer 21.

Accordingly, a part of the mixture lights can be emitted as the white lights L3 having a comparatively lower light-emitting intensity than that of the white lights L1 and L2, outward from the peripheral portion of the transparent layer 18 along with the white lights L1 and L2, which may be emitted with a high light-emitting intensity from the middle portion of the transparent layer 18 and may be emitted with a comparatively low light-emitting intensity from the peripheral portion of the transparent layer 18.

Lights L4 are lights directed toward the transparent layer 18 after lights emitted in a crosswise direction from the light-emitting layer 21 toward the sealing member 17 are reflected on the side surface 15A of the wavelength converting layer 15 contacting with the sealing member 17 and the side surface 11S of the chip substrate 11B and are reflected on the mounting surface 12A of the mounting board 12 and the side surface 15A of the wavelength converting layer 15 again. A part of the above-described lights may repeat a wavelength-conversion by the wavelength converting layer 15 and may be mixed with another part of the lights not wavelength-converted by the wavelength converting layer in directly the lights emitted from the light-emitting layer 21.

Therefore, a part of the mixture lights can be emitted as the white lights L4 having a lower light-intensity than that of the white lights L1 and L2, in which the light-intensity of white lights L4 extremely reduces due to many reflections, outward from the peripheral portion of the transparent layer 18 along with the white lights L3 and along with the white lights L1 and L2, which may be emitted with a high light-emitting intensity from the middle portion of the transparent layer 18 and may be emitted with a comparatively low light-emitting intensity from the peripheral portion of the transparent layer 18.

Thereby, the white lights L3 and L4 may compensate the white lights L1 and L2 having a comparatively low light-emitting intensity emitted from the peripheral portion of the transparent layer 18 as compared with the white lights L1 and L2 emitted from the middle portion of the transparent layer 18. In addition, because the white lights L3 and L4 each having a lower light-intensity than that of the white lights L1 and L2, a disruption of their mixing balances may be difficult to occur. Therefore, the color variability of light emitted from the transparent layer 18 can extremely improve as described with reference to FIG. 5 later. Moreover, the side surface 15A of the wavelength converting layer 15 can be formed in the convex shape toward the sealing member 17.

Consequently, other parts of the white lights L3 and L4 have a long path length, which may include a larger amount of yellow color than that of blue color, may also be emitted from the middle portion of the transparent layer 18 after appropriately mixed with the white lights L1 and L2 having a short path length, which may include a larger amount of blue light than that of yellow light.

As described above, in the semiconductor light-emitting device 10, the side surface 11S of the light-emitting layer 11A can be configured not to be projected from the side surface 11S of the chip substrate 11B so that the top surface 11T of the semiconductor light-emitting chip 11 can be used as the top surface for the light-emitting layer 11A and the chip substrate 11B. Additionally, the wavelength converting layer 15 can be configured to cover the side surface 11S and the top surface 11T of the semiconductor light-emitting chip 11.

Accordingly, a part of lights emitted from the light-emitting layer 11A can be reflected on the side surface 11S and the top surface 11T of the semiconductor light-emitting chip 11 after being reflected by the side surface 15A of the wavelength converting layer 15 contacting with the sealing member 17. Thus, the semiconductor light-emitting device 10 of the disclosed subject matter can improve a chromatic variability by using the above-described lights having a comparatively low light-emitting intensity and a comparatively long path length, and therefore can emit the mixture light having a substantially uniform color tone and having a high light-emitting intensity from a small light-emitting surface.

Moreover, the sealing member 17 and the transparent layer 18 can cover the wavelength converting layer 15 and the semiconductor light-emitting chip 11 in confidence even when the light-emitting device 10 includes the wire bonding WR. Therefore, the disclosed subject matter can provide reliable semiconductor light-emitting devices, which various color lights having a high uniformity and a high light-emitting intensity from a small light-emitting surface.

In the semiconductor light-emitting device 10, an exemplary case where the semiconductor light-emitting chip 13 includes the at least one top electrode 13 and the bottom electrode 11BE is described. However, the semiconductor light-emitting chip 13 can also include the at least one top electrode 13 for a cathode electrode and the at least one top electrode 13 for an anode electrode without the bottom electrode 11BE.

In addition, as disclosed in Patent Document No. 4 by the one of the inventors of this application, a semiconductor light-emitting chip having a bottom cathode electrode, a bottom anode electrode and no top electrode can also be used as the semiconductor light-emitting chip 13. In this case, the transparent layer 18 need not be provided with the cutout section 18A as shown in FIG. 1a. Accordingly, a light-emitting surface of the transparent layer 18 can be formed in various shapes such as a square, a rectangle, a circle, etc.

Next, exemplary variations of the first embodiment will now be described with reference to FIG. 3a to FIG. 3c. FIG. 3a is an enlarged top view showing a first exemplary variation of the semiconductor light-emitting device shown in FIG. 1a, and FIG. 3b is an enlarged side cross-sectional view taken along line X-X shown in FIG. 3a. A difference between the first embodiment and the first variation relates to a location of the opening of the sealing member 17, that is a location of the transparent layer 18.

Figure 2B:
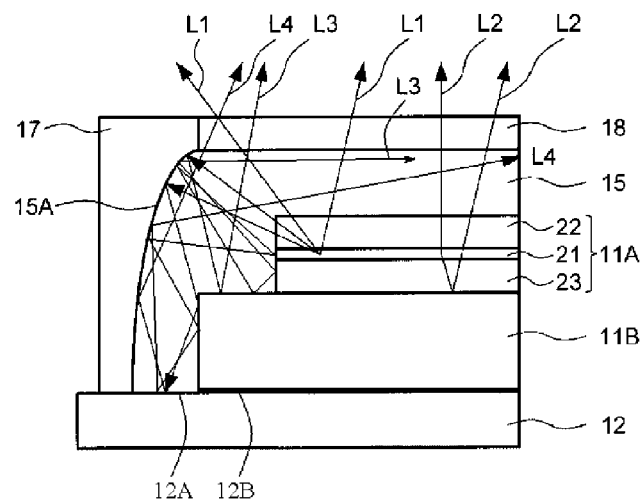
FIG. 2b is an explanatory views depicting movements of mixture lights in the peripheral portion.

According to the semiconductor light-emitting device 30 of the first variation, when the semiconductor light-emitting device 30 is viewed from the position on the main optical axis which extends normal to the top center surface of the semiconductor light-emitting chip 11, a boundary between a sealing member 32 and a transparent layer 33 can be a substantially same location as the side surface 11S of the semiconductor layer 11A except for the cutout section 18A shown in FIG. 1a, and also can be within the side surface 11S of the semiconductor layer 11A except for the cutout section 18A. In this case, an amount of the mixture lights L3 and L4 emitted from the peripheral potion of the transparent layer 33 as shown in FIG. 2b may decrease. However, because the transparent layer 33 used as a light-emitting surface also becomes smaller, a light-intensity of the mixture lights L1 and L2 emitted from the peripheral portion of the transparent layer 33 may be higher as compare with the first embodiment.

In addition, an amount of the mixture lights L3 and L4 having a long path length directed toward the middle portion of the transparent layer 33 may increase, and the mixture lights L3 and L4 including a comparatively large yellow color can be approximately mixed with the mixture lights L1 and L2 including a comparatively large blue color. Thus, the semiconductor light-emitting device 30 can also provide white color light having a high uniformity and a high light-emitting intensity from the small light-emitting surface of the device 30.

In the above-described embodiments, when the resin of the transparent layer 18 is same as a resin included in the wavelength converting layer 15, the transparent layer 18 can be replaced by the resin included in the wavelength converting layer 15 as shown in FIG. 3c. Specifically, a specific gravity of the phosphor 16 is larger than that of the resin such as a transparent silicon resin and the like in general. Accordingly, when an uncured wavelength converting material is solidified under a predetermined temperature after the uncured wavelength converting material disposes around the semiconductor light-emitting chip 11, the phosphor 16 may precipitate and the resin included in the wavelength converting material layer 15 may be replaced as the transparent layer 18 as shown in FIG. 3c.

FIG. 4 is a comparative embodiment for evaluating the first embodiment and the first variation of the first embodiment. A difference between the comparative embodiment and the first embodiment (semiconductor light-emitting device 10 shown in FIG. 1a) and the first variation (semiconductor light-emitting device 30 shown in FIG. 3a) relates to a location of the sealing member 17. The comparative embodiment 100 includes a sealing member 102 contacting the side surface 11S of the chip substrate 11B, and thereby a wavelength converting layer 101 covering only the side surface 11S of the light-emitting layer 11A and the top surface 11T of the light-emitting chip 11 without covering the side surface 11S of the chip substrate 11B.

Figure 9A:
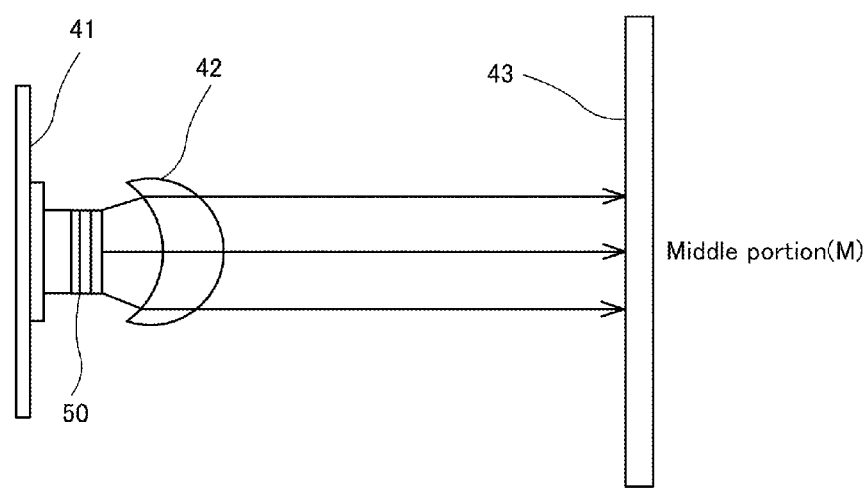
FIG. 9a is a side view showing an evaluating method for the second conventional semiconductor light-emitting device.
Figure 9B:
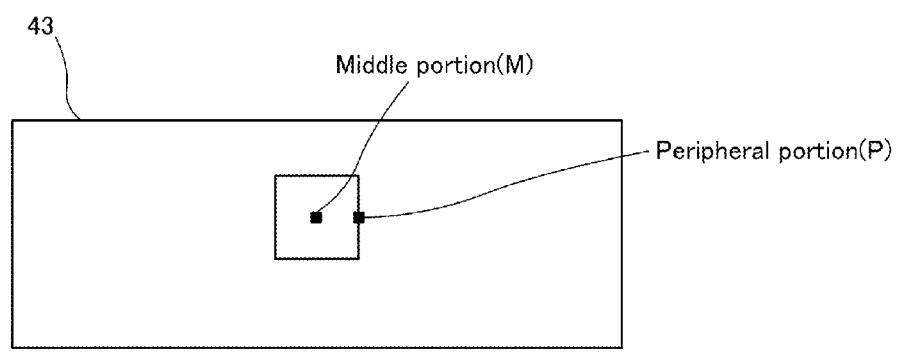

FIG. 5 is a table showing an evaluating result of the first embodiment, the first variation and the comparative embodiment shown in FIG. 4a, when the first embodiment, the first variation and the comparative embodiment are evaluated by the measuring method shown in FIG. 9a and FIG. 9b. According to Japanese Industrial Standard (JIS) Z8110, pure white color is defined as Chromaticity value (0.33, 0.33).

The semiconductor light-emitting device 10 of the first embodiment shows an emission of a substantially pure white color at the middle portion and the peripheral portion, and also a difference of chromaticity values at the middle portion and the peripheral portion is small. This means that the semiconductor light-emitting device 10 of the first embodiment can emit a substantially white light having a high uniformity from the whole transparent layer 18.

In addition, the semiconductor light-emitting device 30 of the first variation, in which the light-emitting surface thereof is smaller than that of the light-emitting device 10, also shows an emission of a purer white color at the middle portion and the peripheral portion, and also a difference of chromaticity values at the middle portion and the peripheral portion is smaller than that of the light-emitting device 10. This means that the semiconductor light-emitting device 30 can emit a substantially white color light having a higher uniformity than that emitted from the light-emitting device 10 from a smaller light-emitting surface.

On the other hand, the semiconductor light-emitting device 100 of the comparative embodiment shows a substantially pure white color at the middle portion, however, shows a yellowish white color at the peripheral portion, which have a long path length in the wavelength converting layer 101. Hence, a difference of chromaticity values at the middle portion and the peripheral portion is also larger than these of the light-emitting devices 10 and 30. This means that light emitted from the light-emitting device 100 is a lower uniformity than these emitted from the light-emitting devices 10 and 30.

Figure 6A:
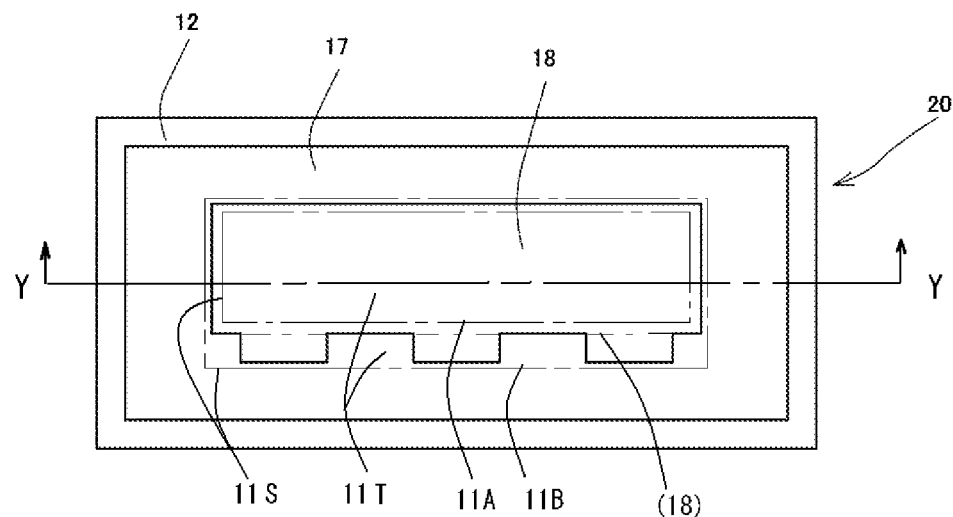
FIG. 6a is an enlarged top view showing a second exemplary embodiment of the semiconductor light-emitting device made in accordance with principles of the disclosed subject matter.
Figure 6B:
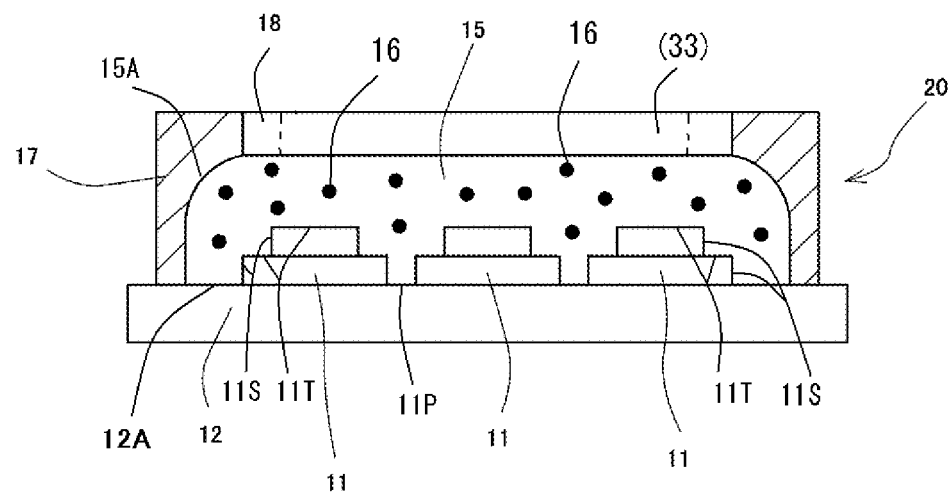
Figure 7:
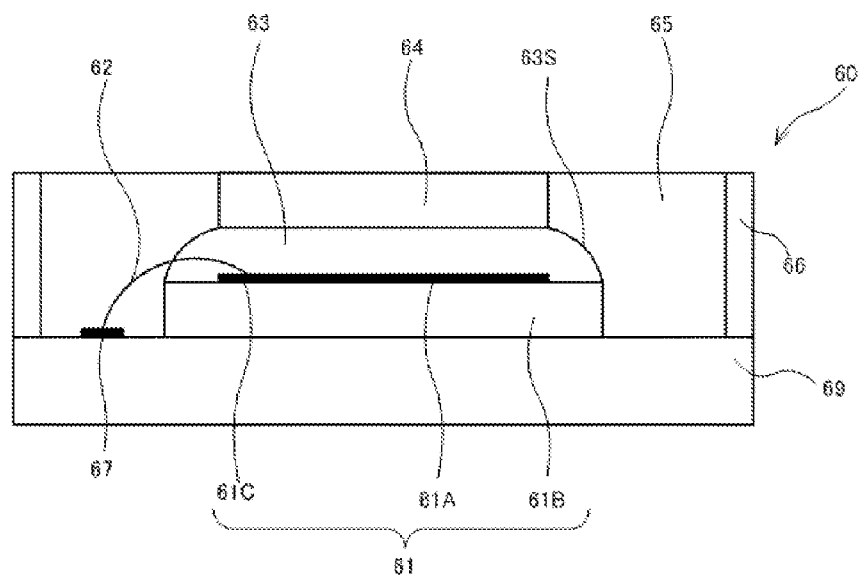
FIG. 7 is an enlarged cross-sectional view showing a first conventional semiconductor light-emitting device.
Figure 8A:
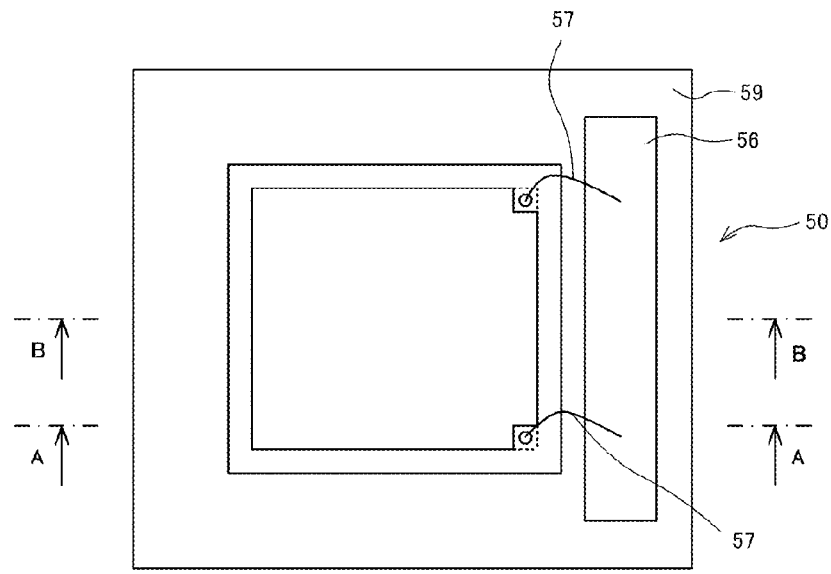
FIG. 8a is an enlarged top view showing a second conventional semiconductor light-emitting device.
Figure 8B:
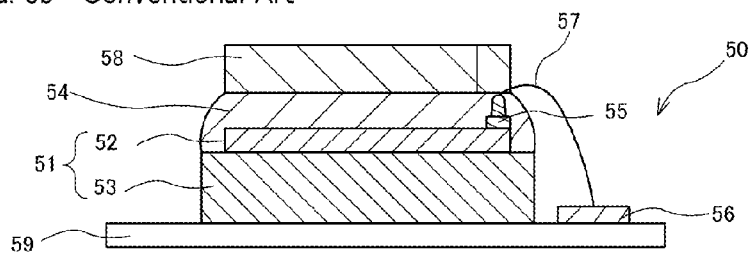
FIGS. 8b and 8c are enlarged side cross-sectional views taken along lines A-A and B-B shown in FIG. 8a, respectively.
Figure 8C:
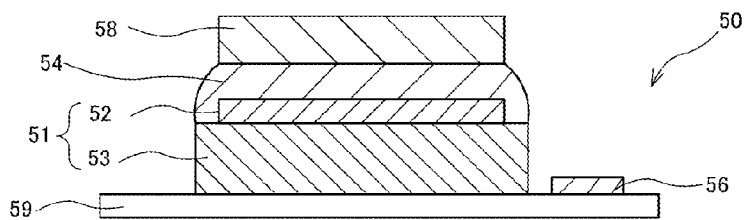

FIG. 6a is an enlarged top view showing a second exemplary embodiment of the semiconductor light-emitting device made in accordance with principles of the disclosed subject matter, and FIG. 6b is an enlarged side cross-sectional view taken along lines Y-Y. A difference between the second embodiment and the first embodiment relates to the number of the light-emitting chip 11. The semiconductor light-emitting device 20 can include a plurality of the semiconductor light-emitting chips 11 mounted on the mounting surface 12A of the mounting board 12.

In this case, the semiconductor light-emitting device 20 can include the transparent layer 18 located over the top surface 11T of the plurality of the semiconductor light-emitting chips 11, which is defined as two top surface 11T including at least one imaginary extending surface of each of the semiconductor layer 11A and the chip substrate 11B between the adjacent light-emitting chips 11 as shown in FIG. 6a, and located between the side surface 11S of the chip substrate 11B, which is defined as one side surface 11S including at least two imaginary extending surface between the adjacent light-emitting chips 11 as shown in FIG. 6a, and the side surface 11S of the semiconductor layer 11A, which is defined as one side surface 11S including at least two imaginary extending surface between the adjacent light-emitting chips 11 as shown in FIG. 6a, using the structure of the first embodiment.

In addition, the semiconductor light-emitting device 20 can also include the transparent layer 33 located within the side surface 11S of the semiconductor layer 11A of the light-emitting chips 11 using the above-described structure of the first variation of the first embodiment. The semiconductor light-emitting device 20 can the transparent layer 18 (33) formed in various shapes in accordance with each location of the electrodes of the light-emitting chips 11 as described above, and also can remove the transparent layer 18 by using the structure of the above-described second variation.

In the above-described various second embodiments, the semiconductor light-emitting device 20 can also provide the mixture lights having a substantially uniform color tone and a higher light-emitting intensity due to the plurality of the chips 11 by adjusting the shape of the side surface 15A of the wavelength converting layer 15 and a respective one of spaces 11P between the adjacent light-emitting chips 11 in accordance with each of optical characteristics of the semiconductor light-emitting chips 11 and each of characteristics of the wavelength converting layer 15 such as a thickness, a density, a kind of the phosphor 16, etc.

As described above, the disclosed subject matter is not only directed toward the lighting-emitting devices that form a light-emitting surface in a small shape such that is the same as, or slightly smaller than the top surface 11T of the semiconductor light-emitting chip 11. The disclosed subject matter is also directed toward the light-emitting devices having a light-emitting surface in a smaller shape than the top surface 11T of the semiconductor layer 11A by using the light-emitting surface of the transparent layer 18, and which can improve a chromatic variation of the mixture light by using the side surface 15A of the wavelength converting layer 15 and the top surface 11S and the side surface of the chip substrate 11B of the light-emitting chips 11, which are covered by the wavelength converting layer 15.

In addition, the disclosed subject matter can include the structures, which can efficiently use lights reflected on the mounting surface 11A of the mounting board 11, and also which can protect the wavelength converting layer 15 and the semiconductor light-emitting chip 11 in confidence even when the light-emitting devices include the wire bonding WR. Thus, the disclosed subject matter can provide semiconductor light-emitting devices having a high reliability, a high uniform color tone and a high light-emitting efficiency, which can be used for lighting units such as a vehicle headlight, general lighting and the like, which must be maintained at a high quality even when they have been used for a long time under harsh conditions.

Furthermore, the above-described semiconductor light-emitting device can incorporate various colored lights by combining the above-described semiconductor chip 13 with the wavelength converting layer 15 including at least one phosphor 16, and therefore can also be used as a light source device for various applications such as a street light, stage lighting, traffic lights, etc. In addition, it is conceived that each of the different aspects and features of the different embodiments disclosed herein could be used interchangeably in and with the other disclosed embodiments. Moreover, each of the specifically referenced features of each of the disclosed embodiments can be interchanged with each other in the various embodiments in all possible combinations of the referenced features.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A semiconductor light-emitting device comprising:
a mounting board having a mounting surface;
at least one semiconductor light-emitting chip having a top surface, a side surface, a bottom surface and chip electrodes, including a semiconductor layer having the top surface and the side surface, and including a chip substrate having the top surface, the side surface and the bottom surface, the side surface of the semiconductor layer located between the top surface of the semiconductor layer and the top surface of the chip substrate, the side surface of the chip substrate located between the top surface of the chip substrate and the bottom surface of the chip substrate, each of the chip electrodes formed on the top surface of the semiconductor layer, and the at least one semiconductor light-emitting chip being mounted on the mounting surface of the mounting board;
a wavelength converting layer having a side surface including at least one phosphor, covering the top surface and the side surface of the at least one semiconductor light-emitting chip, and the wavelength converting layer contacting with the side surface of the chip substrate of the at least one semiconductor light-emitting chip;
a sealing member having an opening mounted on the mounting surface of the mounting board, the opening of the sealing member located over the top surface of the semiconductor light-emitting chip, being smaller than the top surface of the semiconductor light-emitting chip, and located in a substantially parallel direction with the top surface of the semiconductor layer, and the sealing member contacting with the side surface of the wavelength converting layer;
a transparent layer having a cutout section disposed into the opening of the sealing member, wherein the sealing member projects toward the cutout section of the transparent layer, and therefore the sealing member covers each of the chip electrodes of the semiconductor light-emitting chip from in an upward direction of the cutout section; and
wherein the side surface of the wavelength converting layer is formed in a convex shape toward the sealing member, and the transparent layer is larger than the top surface of the semiconductor layer of the at least one semiconductor light-emitting chip.

2. The semiconductor light-emitting device according to claim 1, wherein a light-emitting layer of the semiconductor layer is formed between an n-typed semiconductor layer and a p-typed semiconductor layer.

3. The semiconductor light-emitting device according to claim 1, wherein the at least one semiconductor light-emitting chip and the at least one phosphor are one combination of the at least one semiconductor light-emitting chip is a blue light-emitting chip and the at least one phosphor of the wavelength converting layer is selected from the group consisting of a yellow phosphor, and two phosphors including a red phosphor layer and a green phosphor layer, and the at least one semiconductor light-emitting chip is an ultraviolet light-emitting chip and the at least one phosphor of the wavelength converting layer includes at least one of a red phosphor layer, a green phosphor layer and a blue phosphor.

4. The semiconductor light-emitting device according to claim 1, wherein the mounting board is composed of either one of an Aluminum nitride substrate or a ceramic substrate.

5. The semiconductor light-emitting device according to claim 1, wherein the wavelength converting layer includes a transparent bead including at least one of oxide silicon (SiO2) and alumina.

6. The semiconductor light-emitting device according to claim 1, wherein the sealing member includes at least one of titanic oxide, alumina, and zinc oxide.

7. The semiconductor light-emitting device according to claim 1, wherein when at least one of the chip electrodes of the semiconductor light-emitting chip is formed on the bottom surface of the chip substrate, at least one of a reflective layer and a contact layer is formed between the at least one of the chip electrodes and the bottom surface of the chip substrate.

8. The semiconductor light-emitting device according to claim 1, wherein when at least one of the chip electrodes of the semiconductor light-emitting chip is formed on the top surface of the semiconductor layer, the sealing member covers the at least one of the chip electrode.

9. The semiconductor light-emitting device according to claim 1, wherein when the chip electrodes of the semiconductor light-emitting chip are formed on the bottom surface of the chip substrate, the transparent layer is formed in one shape of a square shape, a rectangular shape, a circular shape and an ellipsoidal shape.

10. A semiconductor light-emitting device comprising:
a mounting board having a mounting surface;
at least one semiconductor light-emitting chip having a top surface, a side surface, a bottom surface and chip electrodes, including a semiconductor layer having the top surface and the side surface, and including a chip substrate having the top surface, the side surface and the bottom surface, the side surface of the semiconductor layer located between the top surface of the semiconductor layer and the top surface of the chip substrate, the side surface of the chip substrate located between the top surface of the chip substrate and the bottom surface of the chip substrate, each of the chip electrodes formed on the top surface of the semiconductor layer, and the at least one semiconductor light-emitting chip being mounted on the mounting surface of the mounting board;
a wavelength converting layer having a side surface including at least one phosphor, covering the top surface and the side surface of the at least one semiconductor light-emitting chip, and the wavelength converting layer contacting with the side surface of the chip substrate of the at least one semiconductor light-emitting chip;
a sealing member having an opening mounted on the mounting surface of the mounting board, the opening of the sealing member located over the top surface of the semiconductor light-emitting chip, being smaller than the top surface of the semiconductor light- emitting chip, and located in a substantially parallel direction with the top surface of the semiconductor layer, and the sealing member contacting with the side surface of the wavelength converting layer;
a transparent layer having a cutout section disposed into the opening of the sealing member, wherein the sealing member projects toward the cutout section of the transparent layer, and therefore the sealing member covers each of the chip electrodes of the semiconductor light-emitting chip from in an upward direction of the cutout section; and
wherein the side surface of the wavelength converting layer is formed in a convex shape toward the sealing member, and the transparent layer is larger than the top surface of the semiconductor layer of the at least one semiconductor light-emitting chip.

11. The semiconductor light-emitting device according to claim 10, wherein a light-emitting layer of the semiconductor layer is formed between an n-typed semiconductor layer and a p-typed semiconductor layer.

12. The semiconductor light-emitting device according to claim 10, wherein the at least one semiconductor light-emitting chip and the at least one phosphor are one combination of the at least one semiconductor light-emitting chip is a blue light-emitting chip and the at least one phosphor of the wavelength converting layer is selected from the group consisting of a yellow phosphor, and two phosphors including a red phosphor layer and a green phosphor layer, and the at least one semiconductor light-emitting chip is an ultraviolet light-emitting chip and the at least one phosphor of the wavelength converting layer includes at least one of a red phosphor layer, a green phosphor layer and a blue phosphor.

13. The semiconductor light-emitting device according to claim 10, wherein the mounting board is composed of either one of an Aluminum nitride substrate or a ceramic substrate.

14. The semiconductor light-emitting device according to claim 10, wherein the wavelength converting layer includes a transparent bead including at least one of oxide silicon (SiO2) and alumina.

15. The semiconductor light-emitting device according to claim 10, wherein the sealing member includes at least one of titanic oxide, alumina, and zinc oxide.

16. The semiconductor light-emitting device according to claim 10, wherein when at least one of the chip electrodes of the semiconductor light-emitting chip is formed on the bottom surface of the chip substrate, at least one of a reflective layer and a contact layer is formed between the at least one of the chip electrodes and the bottom surface of the chip substrate.

17. The semiconductor light-emitting device according to claim 10, wherein when at least one of the chip electrodes of the semiconductor light-emitting chip is formed on the top surface of the semiconductor layer, the sealing member covers the at least one of the chip electrode.

18. The semiconductor light-emitting device according to claim 10, wherein when the chip electrodes of the semiconductor light-emitting chip are formed on the bottom surface of the chip substrate, the opening of the sealing member is formed in one shape of a square shape, a rectangular shape, a circular shape and an ellipsoidal shape.

19. A semiconductor light-emitting device comprising:
a mounting board having a mounting surface;
at least one semiconductor light-emitting chip having a top surface, a side surface, a bottom surface and chip electrodes, including a semiconductor layer having the top surface and the side surface, and including a chip substrate having the top surface, the side surface and the bottom surface, the side surface of the semiconductor layer located between the top surface of the semiconductor layer and the top surface of the chip substrate, the side surface of the chip substrate located between the top surface of the chip substrate and the bottom surface of the chip substrate, one of the chip electrodes formed on the top surface of the semiconductor layer, another of the chip electrodes formed underneath the bottom surface of the chip substrate, and being electrically connected to a first conductor pattern of the mounting surface via a conductive adhesive material, and thereby the at least one semiconductor light-emitting chip being mounted on the mounting surface of the mounting board;

a wavelength converting layer having a side surface including at least one phosphor, covering the top surface and the side surface of the at least one semiconductor light- emitting chip, and the wavelength converting layer contacting with the side surface of the chip substrate of the at least one semiconductor light-emitting chip;

a sealing member having an opening mounted on the mounting surface of the mounting board, the opening of the sealing member located over the top surface of the semiconductor light-emitting chip, being smaller than the top surface of the semiconductor light-emitting chip, and located in a substantially parallel direction with the top surface of the semiconductor layer, and the sealing member contacting with the side surface of the wavelength converting layer;

a transparent layer having a cutout section disposed into the opening of the sealing member, wherein the sealing member projects toward the cutout section of the transparent layer, and therefore the sealing member covers the one of the chip electrodes of the semiconductor light-emitting chip from an upper direction of the cutout section; and wherein the side surface of the wavelength converting layer is formed in a convex shape toward the sealing member, and the transparent layer is larger than the top surface of the semiconductor layer of the at least one semiconductor light-emitting chip.

* * * * *